(12) United States Patent
Tanabe (10) Patent No.: US 11,269,024 B2
(45) Date of Patent: Mar. 8, 2022

(54) MAGNETIC SENSOR

(71) Applicant: TDK Corporation, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 291 days.

(21) Appl. No.: 16/613,671

(22) PCT Filed: May 14, 2018

(86) PCT No.: PCT/JP2018/018543
§ 371 (c)(1),
(2) Date: Nov. 14, 2019

(87) PCT Pub. No.: WO2018/212131
PCT Pub. Date: Nov. 22, 2018

(65) Prior Publication Data
US 2021/0003642 A1 Jan. 7, 2021

(30) Foreign Application Priority Data
May 16, 2017 (JP) .............................. JP2017-097362

(51) Int. Cl.
*G01R 33/09* (2006.01)
*H05K 1/18* (2006.01)
*H01F 7/20* (2006.01)

(52) U.S. Cl.
CPC .............. *G01R 33/09* (2013.01); *H05K 1/181* (2013.01); *H01F 7/20* (2013.01); *H05K 2201/10151* (2013.01)

(58) Field of Classification Search
CPC ........................ G01R 33/09; G01R 33/0052; G01R 33/0011; H05K 1/181; H05K 2201/10151; H05K 2201/083
See application file for complete search history.

(56) References Cited

U.S. PATENT DOCUMENTS 6,344,742 B1    2/2002  Kobayashi et al.
8,193,805 B2 *  6/2012  Kasajima ........... G01R 33/0005
                                                324/207.21
(Continued)

FOREIGN PATENT DOCUMENTS

JP           56-4877 U      1/1981
JP          35-212152 A     8/1993
(Continued)

OTHER PUBLICATIONS

International Search Report issued in corresponding International Patent Application No. PCT/JP2018/018543, dated Aug. 7, 2018, with English translation.

*Primary Examiner* — Dominic E Hawkins
(74) *Attorney, Agent, or Firm* — McDermott Will & emery LLP (57) ABSTRACT

To provide a magnetic sensor capable of supporting a magnetic block stably and allowing a further size reduction of the sensor chip. A magnetic sensor includes a sensor chip and a magnetic block which are mounted on a circuit board. The sensor chip is mounted on the circuit board such that a mounted surface thereof faces a mounting surface, and the magnetic block is mounted on the circuit board such that first and second surfaces and face an element formation surface and the mounting surface, respectively. The magnetic block has a cutout portion, and some of terminal electrodes E11 to E16 are disposed within a space formed by the cutout portion. According to the present invention, the magnetic block can be supported stably. In addition, the presence of the cutout portion in the magnetic block allows a further size reduction of the sensor chip.

8 Claims, 8 Drawing Sheets

(56) References Cited

U.S. PATENT DOCUMENTS

| | | |
|---|---|---|
| 2002/0180430 A1 | 12/2002 | Kang |
| 2009/0045809 A1 | 2/2009 | Kasajima et al. |
| 2009/0284254 A1 | 11/2009 | Kasajima |
| 2016/0322154 A1* | 11/2016 | Park .................... H01F 17/0013 |
| 2018/0313907 A1* | 11/2018 | Fukui ................. G01R 33/0011 |

FOREIGN PATENT DOCUMENTS

| | | |
|---|---|---|
| JP | 11-194159 A | 7/1999 |
| JP | 2009-047444 A | 3/2009 |
| JP | 2009-276159 A | 11/2009 |

* cited by examiner

MAGNETIC SENSOR

CROSS REFERENCE

This application is the U.S. National Phase under 35 U.S.C. § 371 of International Application No. PCT/JP2018/018543, filed on May 14, 2018, which claims the benefit of Japanese Application No. 2017-097362, filed on May 16, 2017, the entire contents of each are hereby incorporated by reference.

TECHNICAL FIELD

The present invention relates to a magnetic sensor having a magnetic block for concentrating magnetic flux on a sensor chip.

BACKGROUND ART

A magnetic sensor using a magnetoresistive element is widely used in an ammeter, a magnetic encoder, and the like. The magnetic sensor is sometimes provided with a magnetic block for concentrating magnetic flux on a sensor chip and, in this case, the magnetic block is placed on the element formation surface of the sensor chip (see Patent Document 1).

CITATION LIST

Patent Document

[Patent Document 1] JP 2009-276159 A

SUMMARY OF INVENTION

Problem to be Solved by the Invention

However, in general, sensor chips have a small size, so that the magnetic block cannot be easily placed on the sensor chip, and thus secure fixation between the sensor chip and the magnetic block is difficult. Particularly, when a magnetic block elongated in the perpendicular direction with respect to the element formation surface is used, the magnetic block is supported on the sensor chip in a very unstable state and may be detached or bent in some cases.

Further, terminal electrodes cannot be disposed on a part of the element formation surface of the sensor chip on which the magnetic block is to be placed, so that, in some layouts, the terminal electrodes need to be arranged in a distributed manner so as to avoid the magnetic block, which disadvantageously increases the size of the sensor chip.

It is therefore an object of the present invention to provide a magnetic sensor capable of supporting the magnetic block stably and allowing a further size reduction of the sensor chip.

Means for Solving the Problem

A magnetic sensor according to the present invention includes: a sensor chip having an element formation surface on which a magnetic detection element and a plurality of terminal electrodes are formed and a mounted surface substantially perpendicular to the element formation surface; a magnetic block having first and second surfaces substantially perpendicular to each other; and a circuit board having a mounting surface on which a plurality of land patterns are formed. The sensor chip is mounted on the circuit board such that the mounted surface faces the mounting surface of the circuit board, and the magnetic block is mounted on the circuit board such that the first and second surfaces face the element formation surface of the sensor chip and the mounting surface of the circuit board, respectively. The magnetic block has a cutout portion positioned between the first and second surfaces, and at least some of the terminal electrodes are disposed within a space formed by the cutout portion.

According to the present invention, the sensor chip and magnetic block are mounted in a laid-down posture on the circuit board, so that the magnetic block can be supported stably. In addition, the presence of the cutout portion in the magnetic block eliminates the need to arrange the terminal electrodes in a distributed manner so as to avoid the magnetic block. This allows a further size reduction of the sensor chip.

In the present invention, there may further be disposed in the space at least some of connection conductors connecting the plurality of terminal electrodes and a plurality of land patterns, respectively. This also prevents interference between the connection conductors and the magnetic block. In this case, the connection conductor may be a solder. The solder is low in melting point, so that the shape thereof may be changed significantly by heat during reflow; however, by disposing the solder within the above space, interference between the magnetic block and the solder can be prevented even if the shape of the solder is changed.

In the present invention, the plurality of terminal electrodes may be arranged at equal intervals along the edge of the element formation surface. This allows a further size reduction of the sensor chip as compared with a case where the terminal electrodes are arranged in a distributed manner so as to avoid the magnetic block.

In the present invention, the cutout portion of the magnetic block may include a third surface substantially parallel to the first surface and a fourth surface substantially parallel to the second surface, and the space may be surrounded by the third surface, fourth surface, mounting surface, and element formation surface. Alternatively, the cutout portion of the magnetic block may include a fifth surface inclined at an obtuse angle with respect to the first and second surfaces, and the space may be surrounded by the fifth surface, mounting surface and element formation surface. Further alternatively, the cutout portion of the magnetic block may include a concave curved surface, and the space may be surrounded by the curved surface, mounting surface, and element formation surface. Thus, the shape of the space formed by the cutout portion is not particularly restricted.

In the present invention, the magnetic detection element may include first through fourth magnetic detection elements. The first and second magnetic detection elements may be positioned on one side as viewed from the first surface of the magnetic block, and the third and fourth magnetic detection elements may be positioned on the other side as viewed from the first surface of the magnetic block. Thus, by forming a bridge circuit using the four magnetic detection elements, highly sensitive magnetic detection can be achieved.

Advantageous Effects of the Invention

As described above, according to the present invention, there can be provided a magnetic sensor capable of supporting the magnetic block stably and allowing a further size reduction of the sensor chip.

BRIEF DESCRIPTION OF DRAWINGS

FIGS. 9A and 9B are views illustrating a magnetic sensor 10A according to a first modification, where FIG. 9A is a schematic perspective view, and FIG. 9B is a schematic side view.

FIGS. 10A and 10B are views illustrating a magnetic sensor 10B according to a second modification, where FIG. 10A is a schematic perspective view, and FIG. 10B is a schematic side view.

MODE FOR CARRYING OUT THE INVENTION

Preferred embodiments of the present invention will be explained below in detail with reference to the accompanying drawings.

Figure 1:
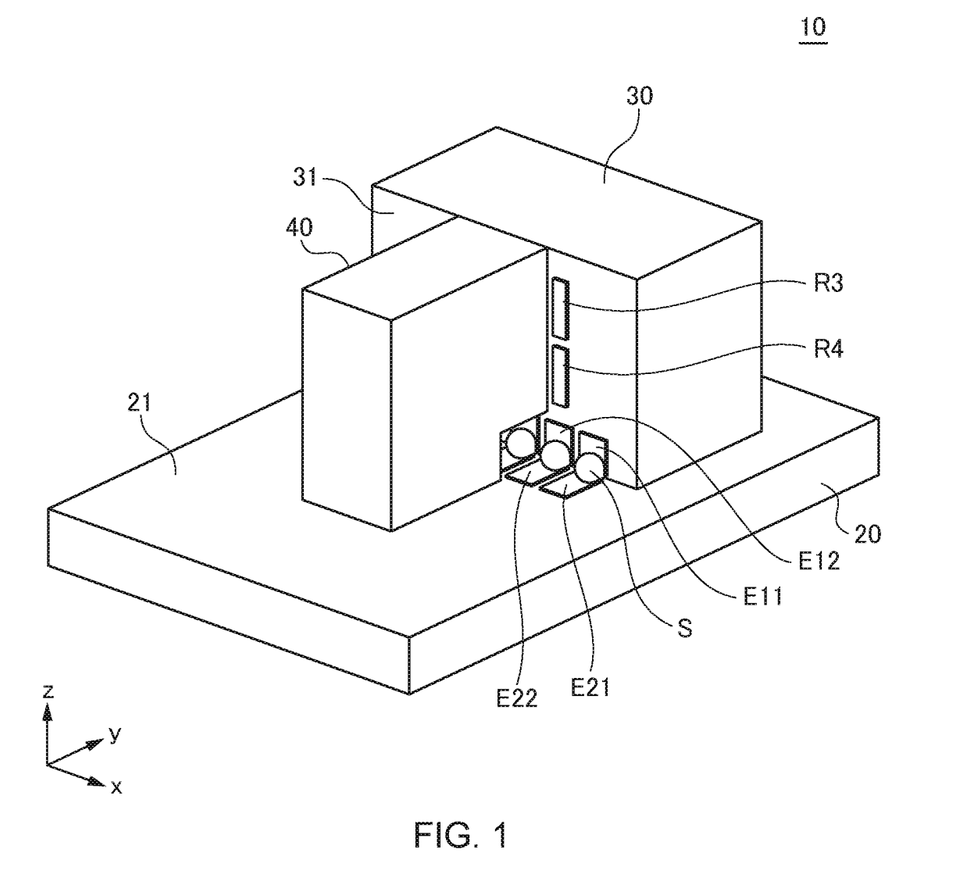
FIG. 1 is a schematic perspective view illustrating the outer appearance of a magnetic sensor 10 according to a preferred embodiment of the present invention.
Figure 2:
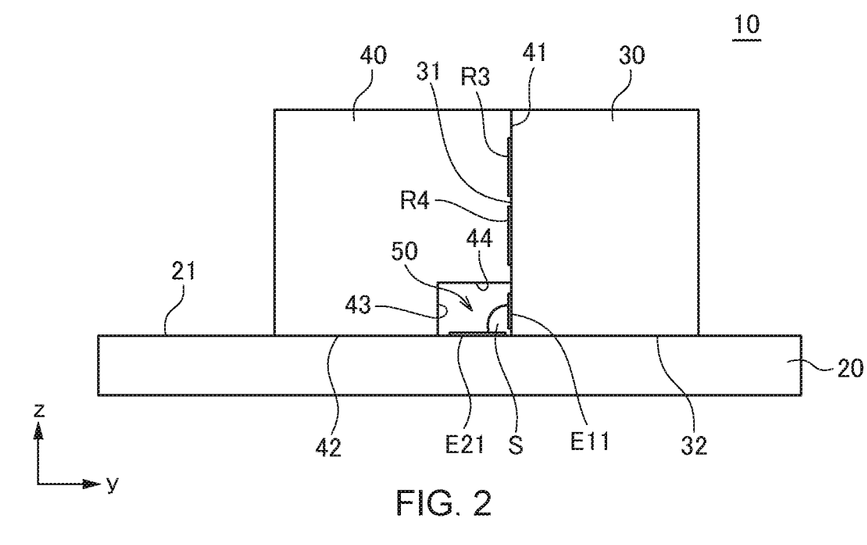
FIG. 2 is a schematic side view of the magnetic sensor 10.
Figure 3:
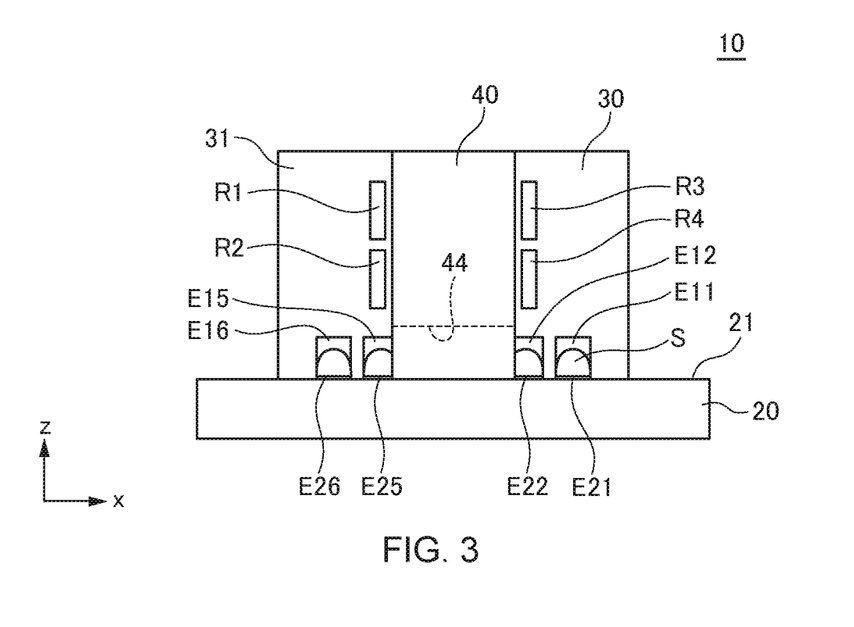
FIG. 3 is a schematic front view of the magnetic sensor 10.
Figure 4:
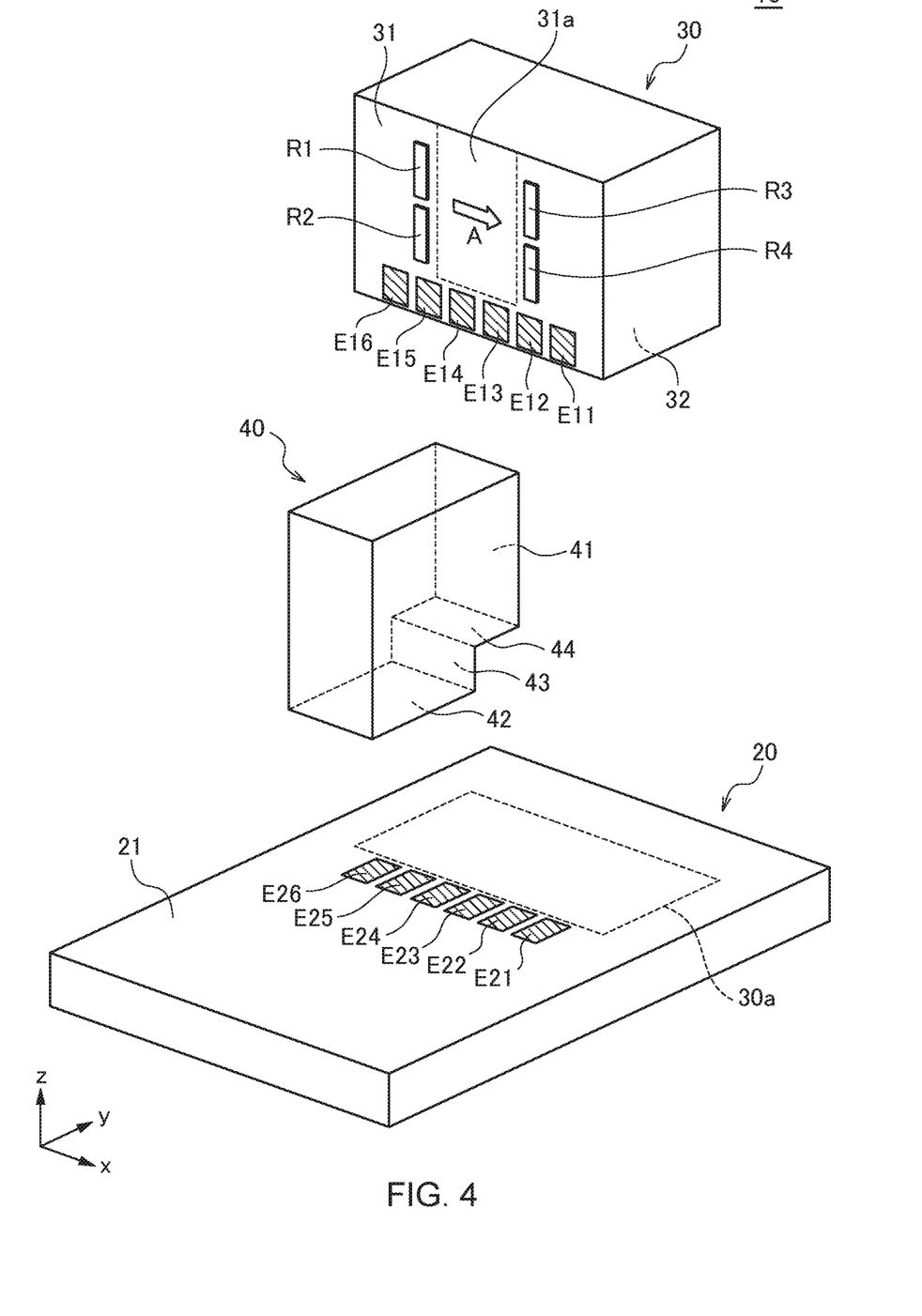
FIG. 4 is a schematic exploded perspective view of the magnetic sensor 10.

FIG. 1 is a schematic perspective view illustrating the outer appearance of a magnetic sensor 10 according to a preferred embodiment of the present invention. FIG. 2 is a schematic side view of the magnetic sensor 10, FIG. 3 is a schematic front view of the magnetic sensor 10, and FIG. 4 is a schematic exploded perspective view of the magnetic sensor 10.

As illustrated in FIGS. 1 to 4, the magnetic sensor 10 according to the present invention includes a circuit board 20, a sensor chip 30 mounted on a mounting surface 21 of the circuit board 20, and a magnetic block 40.

The circuit board 20 is a board having a wiring pattern formed on an insulating base material such as resin and may be a common printed board or an interposer board. The mounting surface 21 of the circuit board 20 constitutes the xy plane and the sensor chip 30 and magnetic block 40 are mounted on the mounting surface 21. The mounting surface 21 of the circuit board 20 has thereon six land patterns E21 to E26.

Figure 5:
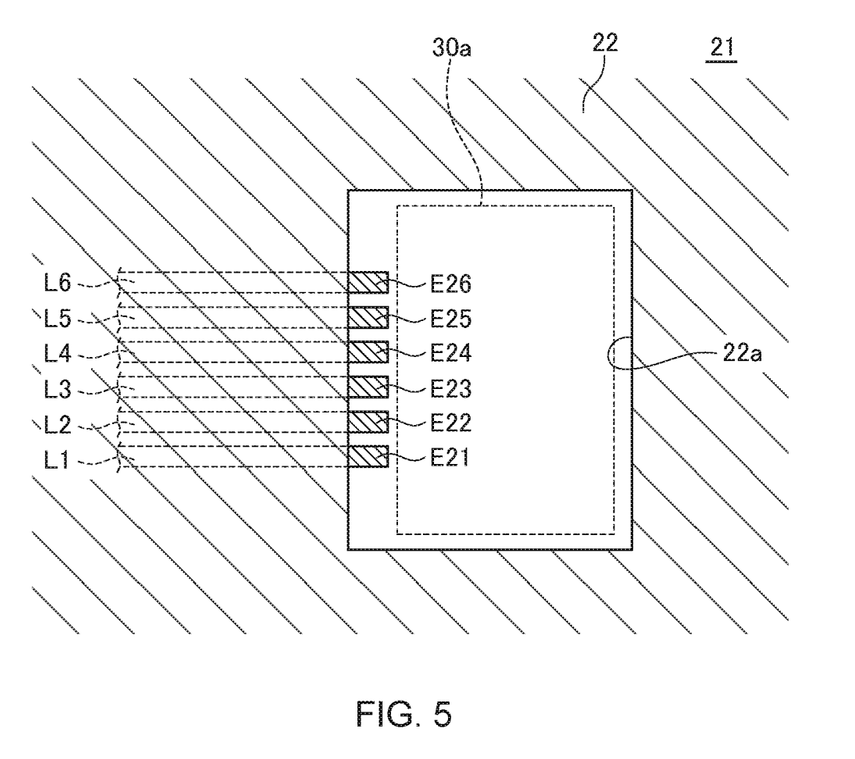
FIG. 5 is an enlarged view of a part of the mounting surface 21 of the circuit board 20.

More specifically, as illustrated in FIG. 5, the major part of the mounting surface 21 of the circuit board 20 is covered with a solder resist 22, and a mounting area 30a of the sensor chip 30 is defined within an opening 22a of the solder resist 22. The solder resist 22 covers a plurality of wiring patterns L1 to L6, and end portions of the respective wiring patterns L1 to L6 exposed in the opening 22a of the solder resist 22 are used as the land patterns E21 to E26, respectively. The wiring patterns L1 to L6 are connected with a power supply or a differential amplifier to be described later.

The sensor chip 30 has a substantially rectangular parallelepiped shape, and four magnetic detection elements R1 to R4 are formed on an element formation surface 31 thereof. The element formation surface 31 constitutes the xz plane, and the sensor chip 30 is mounted on the circuit board 20 such that a mounted surface 32 thereof substantially perpendicular to the element formation surface 31 faces the mounting surface 21 of the circuit board 20. That is, the sensor chip 30 is laid down such that the element formation surface 31 is substantially perpendicular to the mounting surface 21 of the circuit board 20.

The magnetic detection elements R1 to R4 are not particularly limited as long as the physical properties thereof change according to a magnetic flux density, but may each preferably be a magnetoresistive element (MR element) whose electric resistance changes according to the direction of a magnetic field. The fixed magnetization directions of the respective magnetic detection elements R1 to R4 are aligned in a direction (positive side in the x-direction) denoted by arrow A in FIG. 4. A large number of the sensor chips 30 are produced at the same time using an aggregate substrate, followed by separation to form multiple individual pieces. Therefore, according to the present embodiment, the diced sensor chip 30 is mounted on the circuit board 20 so as to be laid down at 90° (horizontally).

Further, six terminal electrodes E11 to E16 are provided on the element formation surface 31 of the sensor chip 30. The terminal electrodes E11 to E16 are connected to their corresponding land patterns E21 to E26 through solders S, respectively. In the present embodiment, the terminal electrodes E11 to E16 are arranged at substantially equal intervals in the x-direction along an edge which is the boundary between the element formation surface 31 and the mounted surface 32.

The magnetic block 40 is made of a high permeability material such as ferrite and has a shape in which apart thereof corresponding to one side of a substantially rectangular parallelepiped shape is cut out. More specifically, the magnetic block 40 has a first surface 41 constituting the xz plane and a second surface 42 constituting the xy plane, and the cutout portion is formed between the first and second surfaces 41 and 42. The cutout portion is constituted by a third surface 43 constituting the xz plane and a fourth surface 44 constituting the xy plane. The magnetic block 40 is mounted on the circuit board 20 such that the first and second surfaces 41 and 42 face the element formation surface 31 of the sensor chip 30 and the mounting surface 21 of the circuit board 20, respectively.

In a state where the magnetic block 40 is mounted on the circuit board 20, the first surface 41 of the magnetic block 40 faces a facing area 31a positioned between the magnetic detection elements R1, R2 and the magnetic detection elements R3, R4. The first surface 41 of the magnetic block 40 and the facing area 31a of the sensor chip 30 may be tightly attached to each other or may face each other through a slight gap. However, in the present embodiment, both the sensor chip 30 and magnetic bock 40 are mounted on the mounting surface 21 of the circuit board 20, so that the sensor chip 30 and magnetic block 40 need not be fixed to each other by an adhesive or the like.

As illustrated in FIG. 2, in a state where the sensor chip 30 and magnetic block 40 are mounted on the circuit board 20, a space 50 is formed at a portion corresponding to the cutout portion of the magnetic block 40. The space 50 is surrounded by the third and fourth surfaces 43 and 44 of the magnetic block 40, the mounting surface 21 of the circuit board 20, and the element formation surface 31 of the sensor chip 30. In the present embodiment, the yz cross section of the space 50 has a rectangular shape.

In the present embodiment, there are accommodated in the space 50, some of the terminal electrodes E11 to E16, some of the land patterns E21 to E26 and some of the solders S connecting the terminal electrodes E11 to E16 and the land patterns E21 to E26, respectively. Thus, unlike a case where the magnetic block 40 does not have the cutout portion, that is, unlike a case where the magnetic block 40 has a substantially rectangular parallelepiped shape, it is not necessary to arrange the terminal electrodes E11 to E16 and the like in a distributed manner so as to avoid the magnetic block 40. This allows the terminal electrodes E11 to E16 to be arranged at substantially equal intervals at substantially the center portion of the element formation surface 31 in the x-direction. Thus, as compared with a case where the terminal electrodes E11 to E16 are arranged in a distributed manner so as to avoid the magnetic block 40, the sensor chip 30 can be reduced in size.

Figure 6:
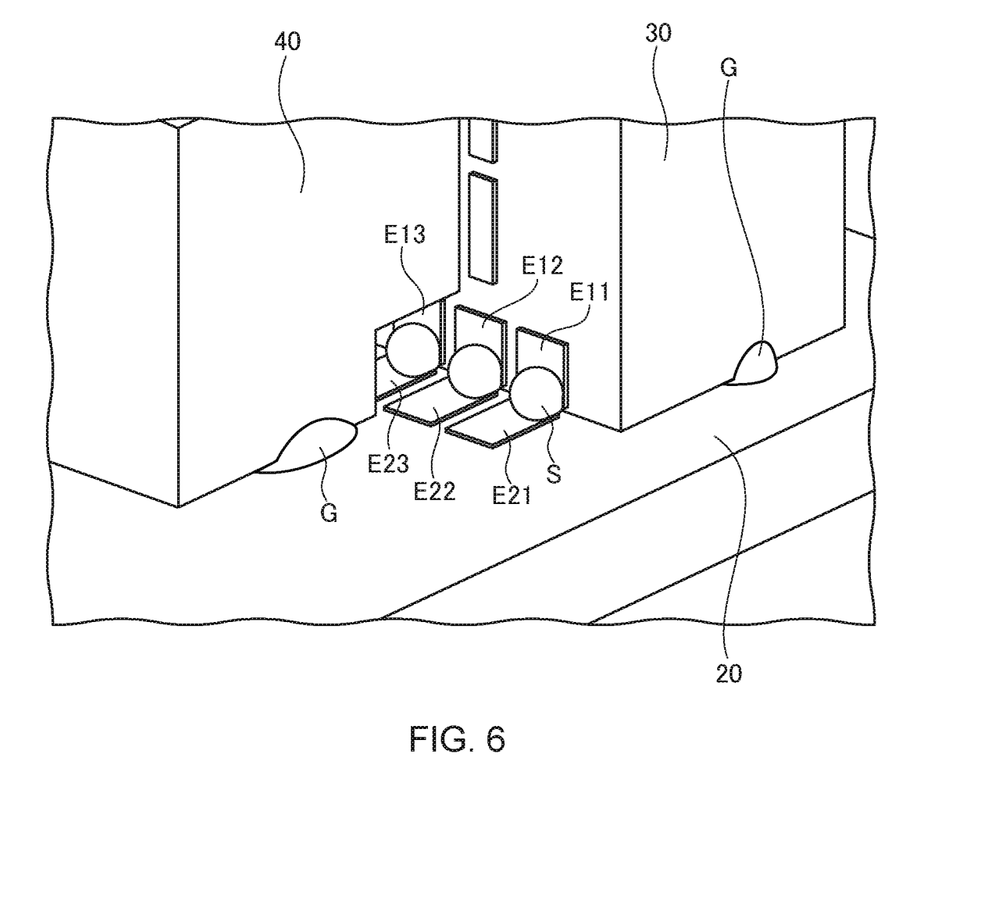
FIG. 6 is an enlarged view of a part of the magnetic sensor 10.

As illustrated in FIG. 6, when the terminal electrodes E11 to E16 formed on the element formation surface 31 and the land patterns E21 to E26 are connected respectively to each other by the solder S, the space 50 formed by the cutout portion of the magnetic block 40 needs to have a size large enough to accommodate at least the solder S. The solder S has a diameter of, e.g., about 100 μm, so that the space 50 needs to be designed to have a sufficient height in the z-direction and a sufficient width in the y-direction such that the magnetic block 40 does not interfere with the solder S. In the present embodiment, the space 50 has a rectangular shape in the yz cross section, so that even when the size of the solder S varies, interference between the solder S and the magnetic block 40 can be prevented.

When the terminal electrodes E11 to E16 are each extended in an L-shape from the element formation surface 31 to the mounted surface 32, parts of the terminal electrodes E11 to E16 that are positioned on the mounted surface 32 and the land patterns E21 to 26 may be connected respectively to each other by the solders S. In this case, the solder S is not exposed to the element formation surface 31 side, or the solder S of a filet shape is exposed slightly to the element formation surface 31 side, so that the size of the space 50 can be reduced more. Further, it is not essential to connect the terminal electrodes E11 to E16 and the land patterns E21 to E26 by the solders S, but other connection conductors such as gold (Au) may be used.

Although the sensor chip 30 is fixed to the circuit board 20, the mounted surface 32 of the sensor chip 30 and the mounting surface 21 of the circuit board 20 may not necessarily be tightly attached to each other, and an adhesive may be interposed therebetween, or a slight gap may exist therebetween due to the partial interposition of an adhesive G as illustrated in FIG. 6. Further, although the magnetic block 40 is fixed to the circuit board 20, the second surface 42 of the magnetic block 40 and the mounting surface 21 of the circuit board 20 may not necessarily be tightly attached to each other, and an adhesive may be interposed therebetween, or a slight gap may exist therebetween due to the partial interposition of an adhesive G as illustrated in FIG. 6.

Although there is no particular restriction on the length of the magnetic block 40 in the y-direction, when the length thereof in the y-direction is increased, selectivity of magnetic flux in the y-direction can be enhanced. In the present embodiment, the y-direction is parallel to the mounting surface 21 of the circuit board 20, so that even when the length of the magnetic block 40 in the y-direction is increased, support for the magnetic block 40 does not become unstable.

Figure 7:
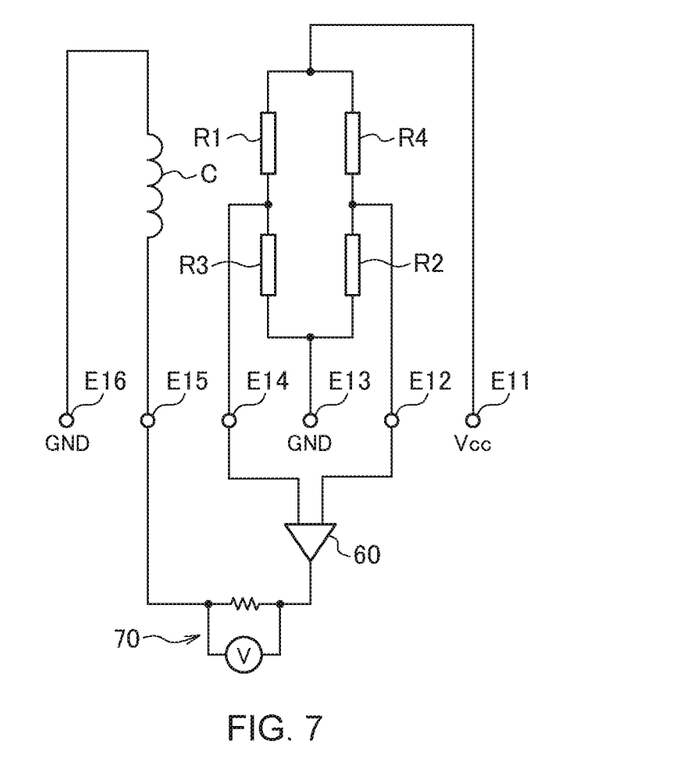
FIG. 7 is a circuit diagram for explaining the connection relationship between the terminal electrodes E11 to E16 and the magnetic detection elements R1 to R4.

FIG. 7 is a circuit diagram for explaining the connection relationship between the terminal electrodes E11 to E16 and the magnetic detection elements R1 to R4.

As illustrated in FIG. 7, the magnetic detection element R1 is connected between the terminal electrodes E11 and E14, the magnetic detection element R2 is connected between the terminal electrodes E12 and E13, the magnetic detection element R3 is connected between the terminal electrodes E13 and E14, and the magnetic detection element R4 is connected between the terminal electrodes E11 and E12. The terminal electrode E11 is applied with a power supply potential Vcc, and the terminal electrode E13 is applied with a ground potential GND. With this configuration, the magnetic detection elements R1 to R4 constitute a differential bridge circuit, and electric resistance change of each of the magnetic detection elements R1 to R4 according to a magnetic flux density appears in the terminal electrodes E12 and E14.

A differential signal output from the terminal electrodes E12 and E14 is input to a differential amplifier 60 provided on the circuit board 20 or outside the circuit board 20. An output signal from the differential amplifier 60 is fed back to the terminal electrode E15. As illustrated in FIG. 7, a compensation coil C is connected between the terminal electrodes E15 and E16 and generates a magnetic field according to the output signal from the differential amplifier 60. With the above configuration, when an electric resistance change of each of the magnetic detection elements R1 to R4 according to a magnetic flux density appears in the terminal electrodes E12 and E14, current according to the magnetic flux density flows in the compensation coil C to generate magnetic flux in the opposite direction to cancel external magnetic flux. Then, when the current output from the differential amplifier 60 is current-to-voltage converted by a detection circuit 70, the magnitude of the external magnetic flux can be detected.

Figure 8:
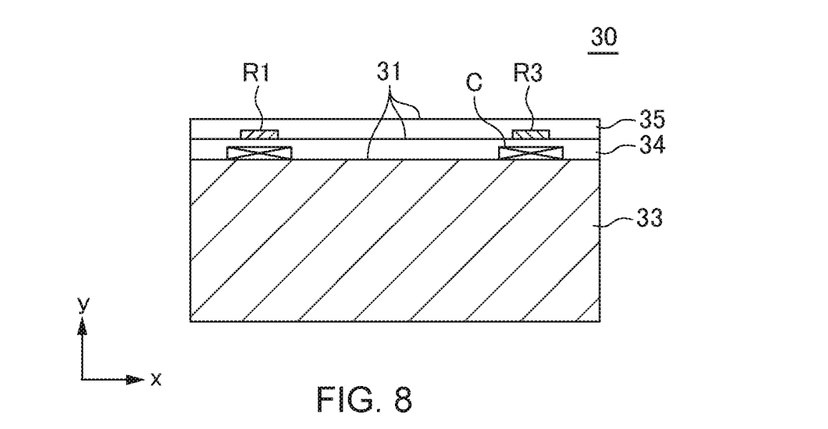
FIG. 8 is a schematic cross-sectional view of the sensor chip 30.

FIG. 8 is a schematic cross-sectional view of the sensor chip 30. In the example illustrated in FIG. 8, the compensation coil C and the magnetic detection element (R1 to R4) are stacked in this order on the surface of a substrate 33 of the sensor chip 30. The compensation coil C is covered with an insulating layer 34, and the magnetic detection elements R1 to R4 are covered with an insulating layer 35. Thus, the element formation surface 31 of the sensor chip 30 may have a multilayer structure. In other words, the element formation surface 31 does not refer to only one specific surface, but, when the element formation surface 31 has a multilayer structure, surfaces (e.g., the surface of the substrate 33, the surface of the insulating layer 34, and the surface of the insulating layer 35) constituting the xy plane each constitute the element formation surface 31.

As described above, in the present embodiment, the element formation surface 31 of the sensor chip 30 is perpendicular to the mounting surface 21 of the circuit board 20, so that even when the length of the magnetic block 40 in the y-direction is increased, the fixing state of the magnetic block 40 does not become unstable.

In addition, in the present embodiment, the cutout portion is formed in the magnetic block 40, and some of the terminal electrodes E11 to E16 and some of the solders S are disposed within the space 50 formed by the cutout portion. Thus, the terminal electrodes E11 to E16 need not be arranged in a distributed manner so as to avoid the magnetic block 40 and may be arranged in a concentrated manner at substantially the center portion of the element formation surface 31 in the x-direction, thus allowing a size reduction of the sensor chip 30. As described above, a large number of the sensor chips 30 are produced by dicing the aggregate substrate, so that size reduction of the sensor chip 30 allows a reduction in manufacturing cost.

The following describes modifications of the magnetic sensor 10 according to the present embodiment.

Figure 9A:
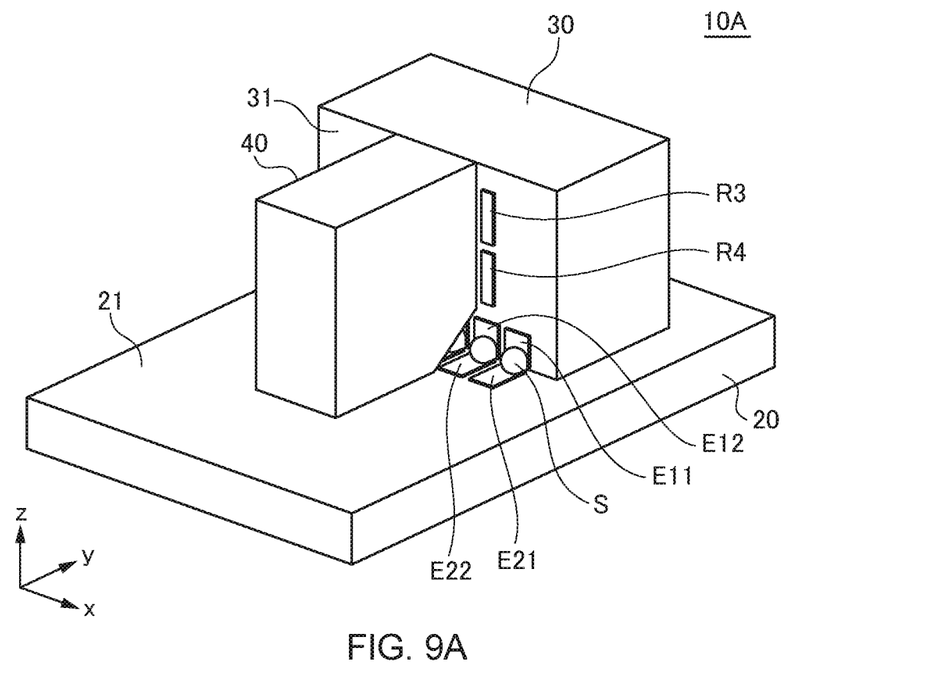
Figure 9B:
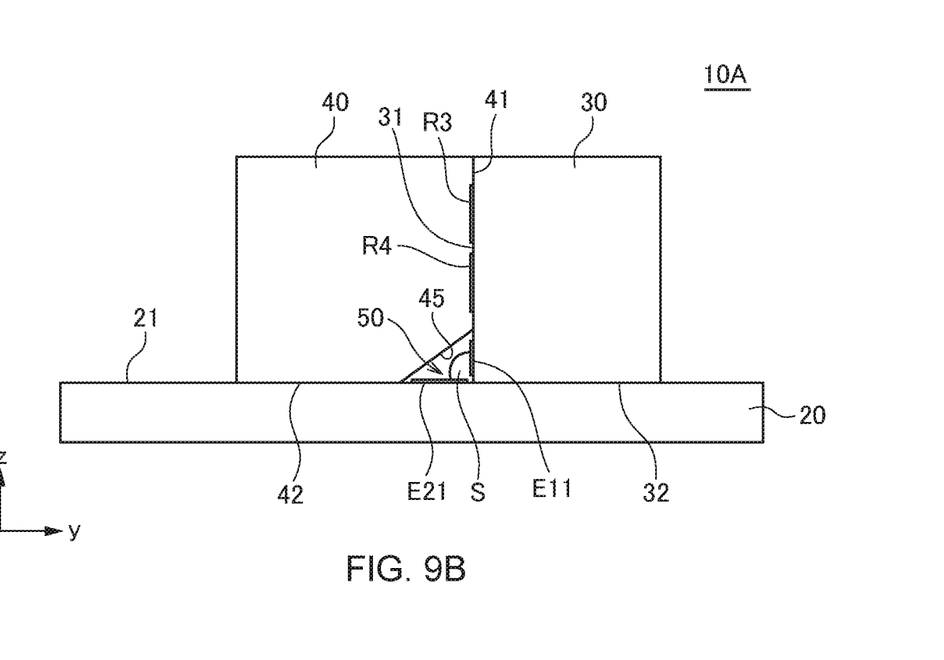

FIGS. 9A and 9B are views illustrating a magnetic sensor 10A according to a first modification, where FIG. 9A is a schematic perspective view, and FIG. 9B is a schematic side view.

As illustrated in FIGS. 9A and 9B, the magnetic sensor 10A according to the first modification differs from the magnetic sensor 10 according to the above-described embodiment in the shape of the cutout portion formed in the magnetic block 40. Other configurations are the same as those of the magnetic sensor 10 according to the embodiment, so the same reference numerals are given to the same elements, and overlapping description will be omitted.

In the first modification, the cutout portion of the magnetic block 40 is constituted by a fifth surface 45 inclined with respect to the xy and xz planes. The fifth surface 45 is inclined at an obtuse angle (e.g., 135°) with respect to the first and second surfaces 41 and 42. Thus, in the present modification, an area surrounded by the fifth surface 45 of the magnetic block 40, the mounting surface 21 of the circuit board 20 and the element formation surface 31 of the sensor chip 30 constitute the space 50, and the yz cross section thereof is triangular. When the cutout portion of the magnetic block 40 is formed into such a shape, the mechanical strength around the cutout portion increases as compared with a case where the yz cross section of the space 50 is rectangular, thus making breaking or chipping of the magnetic block 40 unlikely to occur during and after mounting.

Figure 10A:
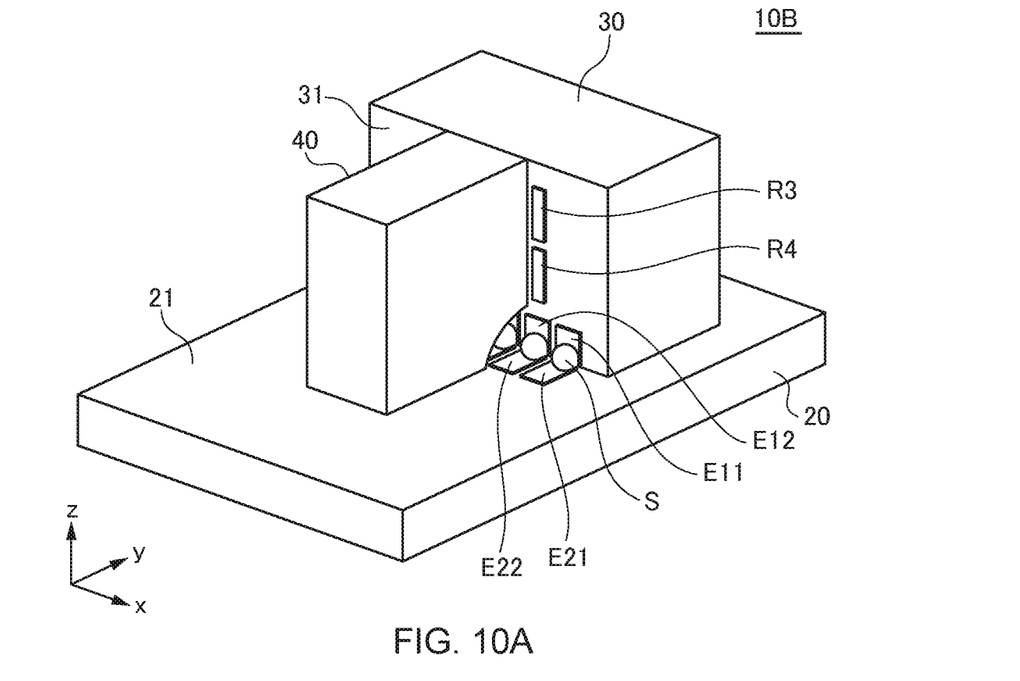
Figure 10B:
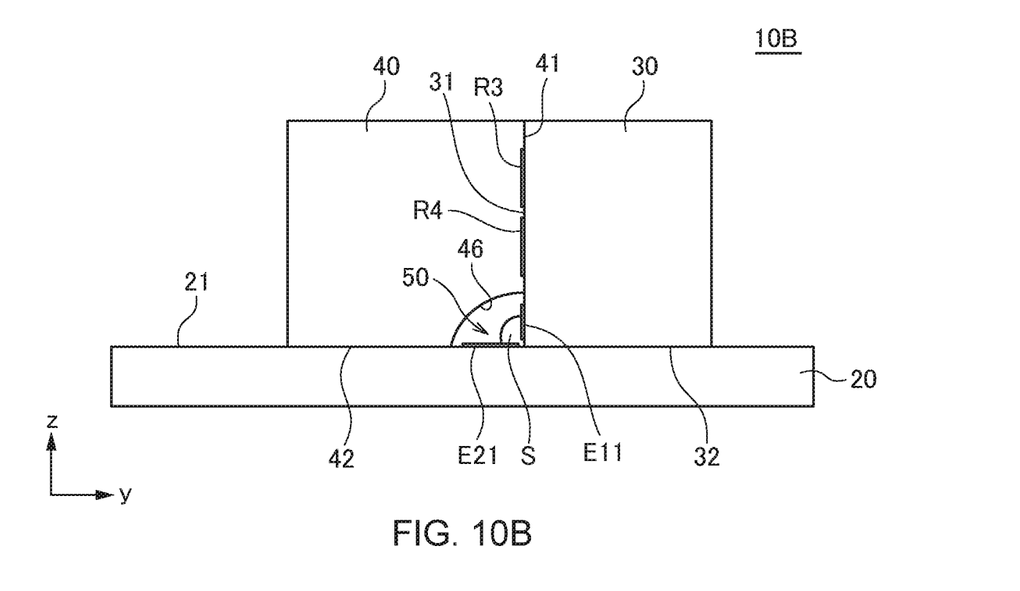

FIGS. 10A and 10B are views illustrating a magnetic sensor 10B according to a second modification, where FIG. 10A is a schematic perspective view, and FIG. 10B is a schematic side view.

As illustrated in FIGS. 10A and 10B, the magnetic sensor 10B according to the second modification differs from the magnetic sensor 10 according to the above-described embodiment in the shape of the cutout portion formed in the magnetic block 40. Other configurations are the same as those of the magnetic sensor 10 according to the embodiment, so the same reference numerals are given to the same elements, and overlapping description will be omitted.

In the second modification, the cutout portion of the magnetic block 40 is constituted by a recessed curved surface 46. In the present modification, an area surrounded by the curved surface 46 of the magnetic block 40, the mounting surface 21 of the circuit board 20 and the element formation surface 31 of the sensor chip 30 constitute the space 50, and the yz cross section thereof is fan-shaped. When the cutout portion of the magnetic block 40 is formed into such a shape, mechanical strength around the cutout portion increases as compared with a case where the yz cross section of the space 50 is rectangular, and interference between the solders S and the magnetic block 40 is less likely to occur as compared with a case where the yz cross section of the space 50 is triangular.

It is apparent that the present invention is not limited to the above embodiments, but may be modified and changed without departing from the scope and spirit of the invention.

REFERENCE SIGNS LIST 10, 10A, 10B magnetic sensor
20 circuit board
21 mounting surface
22 solder resist
22a opening of solder resist
30 sensor chip
30a mounting area
31 element formation surface
31a facing area
32 mounted surface
33 substrate
34, 35 insulating layer
40 magnetic block
41 first surface
42 second surface
43 third surface
44 fourth surface
45 fifth surface
46 curved surface
50 space
60 differential amplifier
70 detection circuit
C compensation coil
E11-E16 terminal electrode
E21-E26 land pattern
G adhesive
L1~L6 wiring pattern
R1-R4 magnetic detection element
S solder

What is claimed is:

1. A magnetic sensor comprising:
a sensor chip having an element formation surface on which a magnetic detection element and a plurality of terminal electrodes are formed and a mounted surface substantially perpendicular to the element formation surface;
a magnetic block having first and second surfaces substantially perpendicular to each other; and
a circuit board having a mounting surface on which a plurality of land patterns are formed,
wherein the sensor chip is mounted on the circuit board such that the mounted surface faces the mounting surface of the circuit board,
wherein the magnetic block is mounted on the circuit board such that the first and second surfaces face the element formation surface of the sensor chip and the mounting surface of the circuit board, respectively, and
wherein the magnetic block has a cutout portion positioned between the first and second surfaces, and at least some of the terminal electrodes are disposed within a space formed by the cutout portion.

2. The magnetic sensor as claimed in claim 1, wherein at least some of connection conductors connecting the plurality of terminal electrodes and a plurality of land patterns, respectively, are further disposed within the space.

3. The magnetic sensor as claimed in claim 2, wherein the connection conductors comprise a solder.

4. The magnetic sensor as claimed in claim 1, wherein the plurality of terminal electrodes are arranged at equal intervals along an edge of the element formation surface.

5. The mage sensor as claimed in claim 1,
wherein the cutout portion of the magnetic block includes a third surface substantially parallel to the first surface and a fourth surface substantially parallel to the second surface, and
wherein the space is surrounded by the third surface, fourth surface, mounting surface, and element formation surface.

6. The magnetic sensor as claimed in claim 1,
wherein the cutout portion of the magnetic block includes a fifth surface inclined at an obtuse angle with respect to the first and second surfaces, and wherein the space is surrounded by the fifth surface, mounting surface and element formation surface.

7. The magnetic sensor as claimed in claim 1, wherein the cutout portion of the magnetic block includes a concave curved surface, and
wherein the space is surrounded by the curved surface, mounting surface, and element formation surface.

8. The magnetic sensor as claimed in claim 1, wherein the magnetic detection element includes first to fourth magnetic detection elements,
wherein the first and second magnetic detection elements are positioned on one side as viewed from the first surface of the magnetic block, and
wherein the third and fourth magnetic detection elements are positioned on other side as viewed from the first surface of the magnetic block.

* * * * *